(12) United States Patent
Lim et al.

(10) Patent No.: US 10,991,857 B2
(45) Date of Patent: Apr. 27, 2021

(54) METHOD OF FABRICATING LIGHT EMITTING DEVICE PACKAGE

(71) Applicant: Samsung Electronics Co., Ltd., Suwon-si (KR)

(72) Inventors: Wan Tae Lim, Suwon-si (KR); Sung Hyun Sim, Uiwang-si (KR); Hanul Yoo, Bucheon-si (KR); Yong Il Kim, Seoul (KR); Hye Seok Noh, Suwon-si (KR); Ji Hye Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/442,870

(22) Filed: Jun. 17, 2019

(65) Prior Publication Data
US 2019/0312182 A1      Oct. 10, 2019

Related U.S. Application Data

(63) Continuation of application No. 15/486,982, filed on Apr. 13, 2017, now Pat. No. 10,326,061.

(30) Foreign Application Priority Data

Aug. 11, 2016  (KR) .................. 10-2016-0102472

(51) Int. Cl.
*H01L 33/50*      (2010.01)
*H01L 25/075*     (2006.01)
(Continued)

(52) U.S. Cl.
CPC ........ *H01L 33/507* (2013.01); *H01L 25/0753* (2013.01); *H01L 27/156* (2013.01);
(Continued)

(58) Field of Classification Search
CPC ....... H01L 2924/00; H01L 2924/00014; H01L 2224/48091; H01L 2924/181; H01L 2924/00012
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

CN     1481032        3/2004
CN     101378103      3/2009
(Continued)

OTHER PUBLICATIONS

Office Action from the Chinese Intellectual Property Office dated Apr. 9, 2019, in corresponding application CN 201710680463.0.
(Continued)

*Primary Examiner* — Tony Tran
(74) *Attorney, Agent, or Firm* — Muir Patent Law, PLLC

(57) ABSTRACT

A method of fabricating a light emitting device package includes forming a plurality of semiconductor light emitting parts, each having a first conductive semiconductor layer, an active layer, and a second conductive semiconductor layer on a growth substrate, forming a partition structure having a plurality of light emitting windows on the growth substrate, filling each of the plurality of light emitting windows with a resin having a phosphor, and forming a plurality of wavelength conversion parts by planarizing a surface of the resin.

20 Claims, 15 Drawing Sheets

(51) Int. Cl.
*H01L 27/15* (2006.01)
*H01L 33/54* (2010.01)
*H01L 33/56* (2010.01)
*H01L 33/58* (2010.01)
*H01L 33/62* (2010.01)
*H01L 33/44* (2010.01)

(52) U.S. Cl.
CPC ............ *H01L 33/504* (2013.01); *H01L 33/54* (2013.01); *H01L 33/56* (2013.01); *H01L 33/58* (2013.01); *H01L 33/62* (2013.01); *H01L 33/44* (2013.01); *H01L 33/505* (2013.01); *H01L 2933/005* (2013.01); *H01L 2933/0041* (2013.01); *H01L 2933/0058* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,633,503 B2 | 1/2014 | Seo | |
| 8,735,931 B2 | 5/2014 | Han et al. | |
| 8,753,908 B2 | 6/2014 | Tsutsui et al. | |
| 8,766,295 B2 | 7/2014 | Kim | |
| 8,927,305 B2 | 1/2015 | Song et al. | |
| 9,257,416 B2 | 2/2016 | Akimoto et al. | |
| 2001/0000436 A1 | 4/2001 | Nose et al. | |
| 2004/0041220 A1 | 3/2004 | Kwak et al. | |
| 2009/0058263 A1 | 3/2009 | Lai | |
| 2014/0034991 A1 | 2/2014 | McKenzie et al. | |
| 2016/0190105 A1 | 6/2016 | Rhee et al. | |

FOREIGN PATENT DOCUMENTS

| | | |
|---|---|---|
| CN | 101388426 | 3/2009 |
| CN | 102157668 | 8/2011 |
| CN | 102237477 | 11/2011 |
| CN | 102456819 | 5/2012 |
| CN | 103227266 | 7/2013 |
| JP | 2005-209852 A | 8/2005 |
| KR | 2015-0021235 A | 3/2015 |

OTHER PUBLICATIONS

Office Action from the Chinese Patent Office dated Dec. 27, 2018, in corresponding patent application CN 2017710680463.0.

II - II'

III-III'

METHOD OF FABRICATING LIGHT EMITTING DEVICE PACKAGE

CROSS-REFERENCE TO RELATED APPLICATION

This application is a Continuation application of U.S. patent application Ser. No. 15/486,982, filed on Apr. 13, 2017, which claims benefit of priority under 35 U.S.C. § 119 to Korean Patent Application No. 10-2016-0102472, filed on Aug. 11, 2016, with the Korean Intellectual Property Office, the disclosure of each of which is incorporated herein by reference in its entirety.

BACKGROUND

1. Field

The present disclosure relates to a method of fabricating a light emitting device package.

2. Description of Related Art

Semiconductor light emitting diode (LED) devices have been used as light sources for various types of electronic products, as well as light sources for lighting devices. In particular, semiconductor LEDs are widely used as light sources for various types of display devices such as televisions, mobile phones, personal computers (PCs), laptop PCs, and personal digital assistants (PDAs).

Conventional display devices used to be commonly liquid crystal displays (LCDs) including liquid crystal display (LCD) panels and backlight units. However, recently, display devices which do not require additional backlighting are under development. For example, LED devices are being developed as respective pixels of a display device. Such display devices may be made to be compact, and may be implemented as high brightness displays with improved optical efficiency as compared to LCDs of the related art. Furthermore, display devices using LEDs as pixels may also allow various aspect ratios of a display, and may be implemented as large display devices, thereby providing various forms of large displays.

SUMMARY

An aspect of the present disclosure may provide a method of fabricating a light emitting device package with improved color reproduction capability.

According to an aspect of the present inventive concept, a method of fabricating a light emitting device package may include: forming a plurality of semiconductor light emitting parts, each having a first conductive semiconductor layer, an active layer, and a second conductive semiconductor layer on a growth substrate, forming a partition structure having a plurality of light emitting windows on the growth substrate, filling each of the plurality of light emitting windows with a resin having a phosphor, and forming a plurality of wavelength conversion parts by planarizing a surface of the resin.

According to an aspect of the present inventive concept, a method of fabricating a light emitting device package may include: forming a plurality of semiconductor light emitting parts, each having a first conductive semiconductor layer, an active layer, and a second conductive semiconductor layer on a growth substrate, forming a partition structure having a plurality of light emitting windows corresponding respectively to the plurality of semiconductor light emitting parts on the growth substrate, dispensing a first resin having one of red, green, and blue phosphors into each of the plurality of light emitting windows, dispensing a second resin on the first resin, the second resin being transparent and not being mixed with a phosphor; and forming a plurality of wavelength conversion parts by planarizing a surface of the second resin.

According to an aspect of the present disclosure, a method of manufacturing a light emitting device package includes steps of: forming a light emitting diode (LED) on a substrate; forming a wavelength conversion part on the LED; planarizing a top surface of the wavelength conversion part by removing a portion of the wavelength conversion part, wherein the wavelength conversion part comprises a first resin layer including a first phosphor material, wherein the light emitting diode includes a first semiconductor layer, a second semiconductor layer, and an active layer disposed between the first semiconductor layer and the second semiconductor layer, wherein the first and second semiconductor layers are doped with impurities, and the first and second semiconductor layers have opposite polarities from each other.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Figure 1:
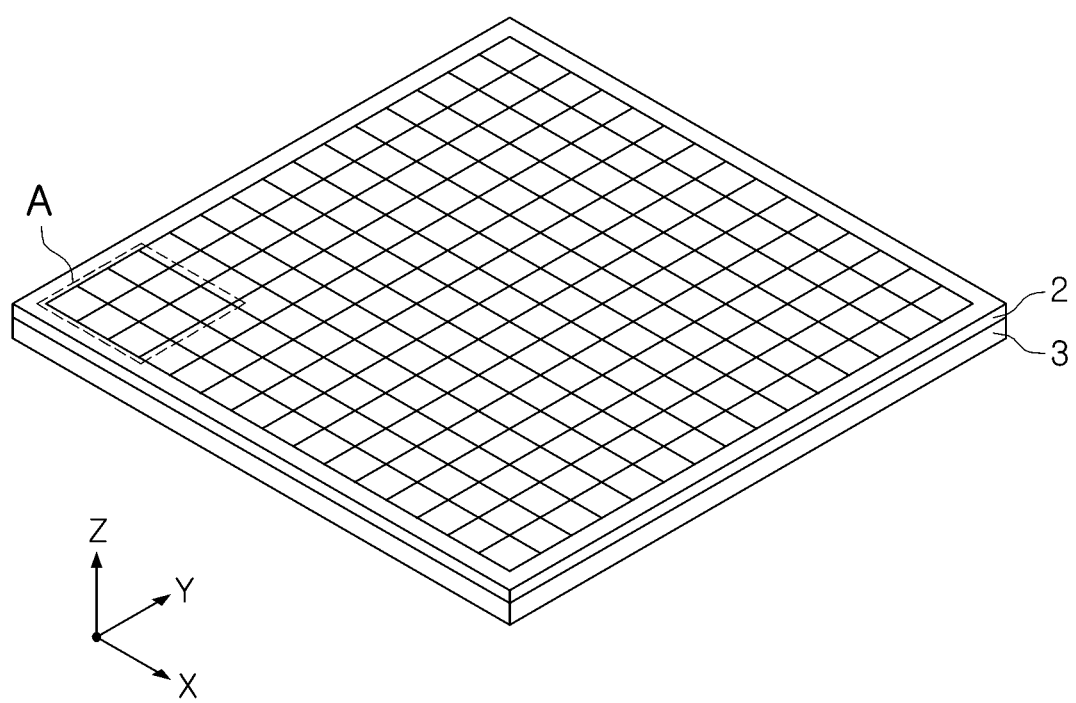
FIG. 1 is a schematic perspective view illustrating a display panel including a light emitting device package according to an example embodiment of the present inventive concept.

Hereinafter, the present disclosure will be described in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Figure 2:
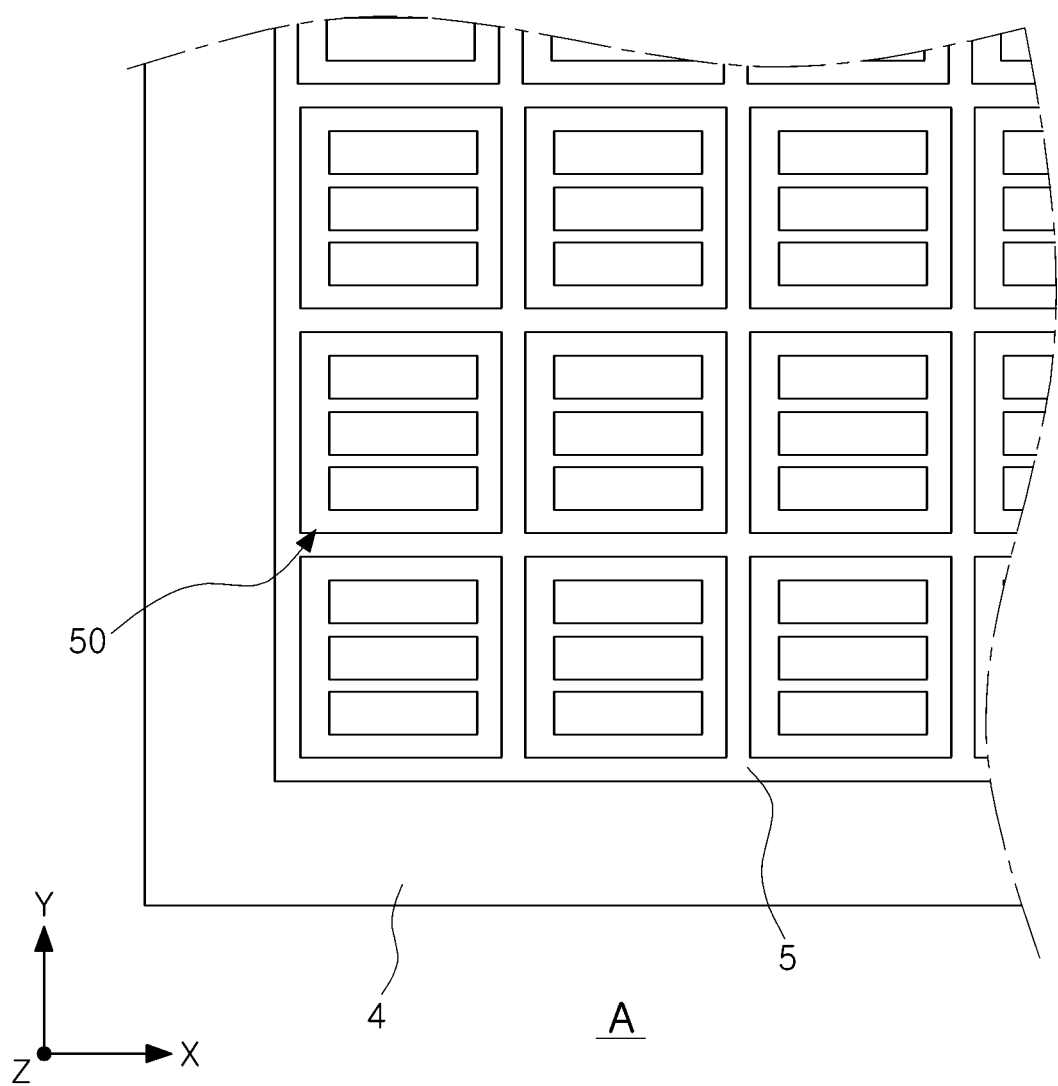
FIG. 2 is an enlarged plan view of region A of FIG. 1.
Figure 3:
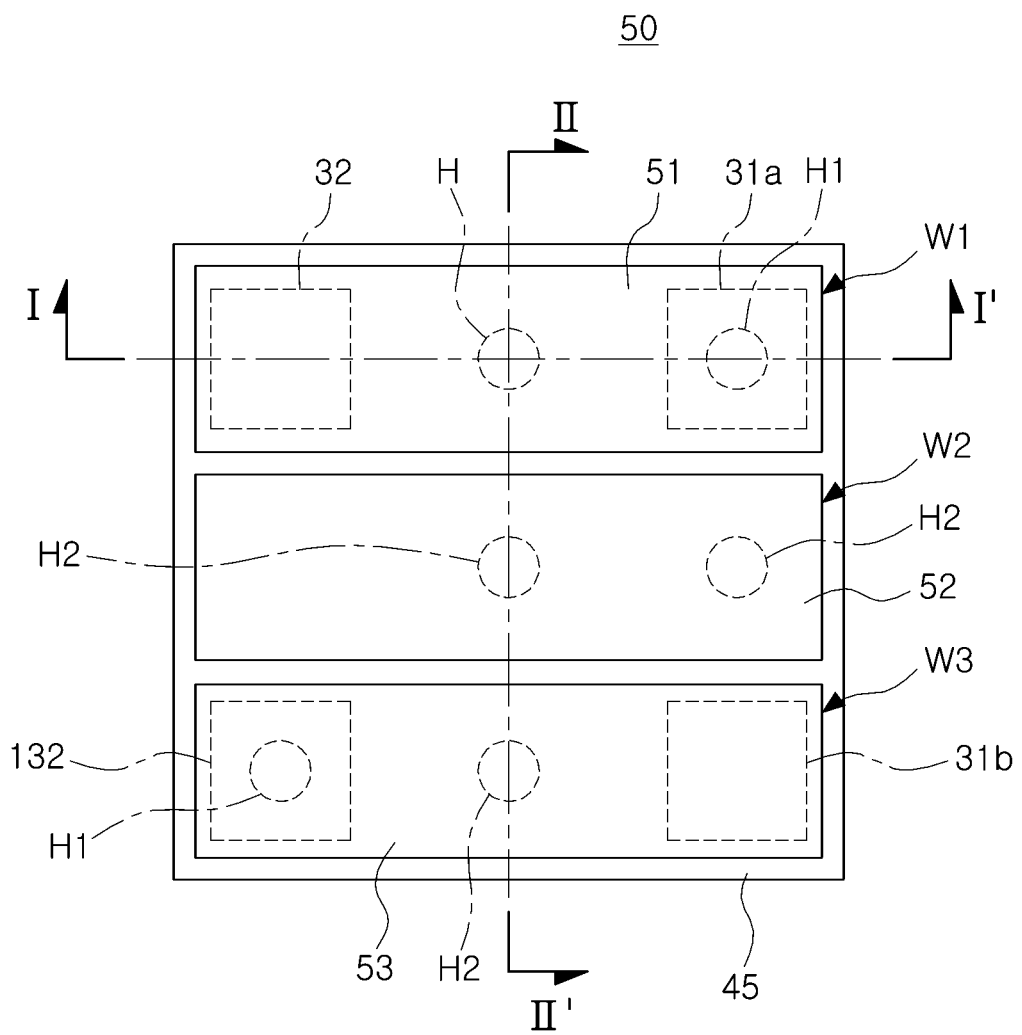
FIG. 3 is a schematic plan view of a light emitting device package according to an example embodiment of the present inventive concept.
Figure 4:
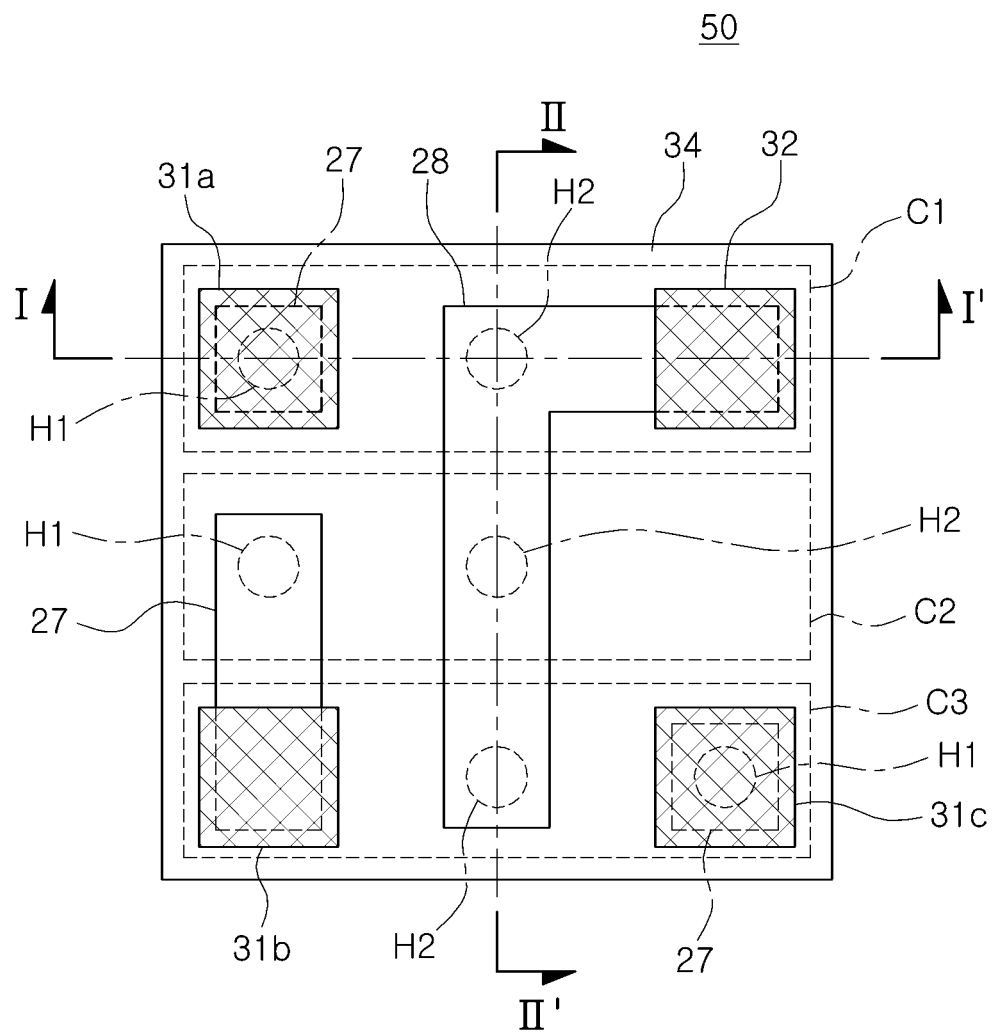
FIG. 4 is a schematic rear view of a light emitting device package according to an example embodiment of the present inventive concept.
Figure 5:
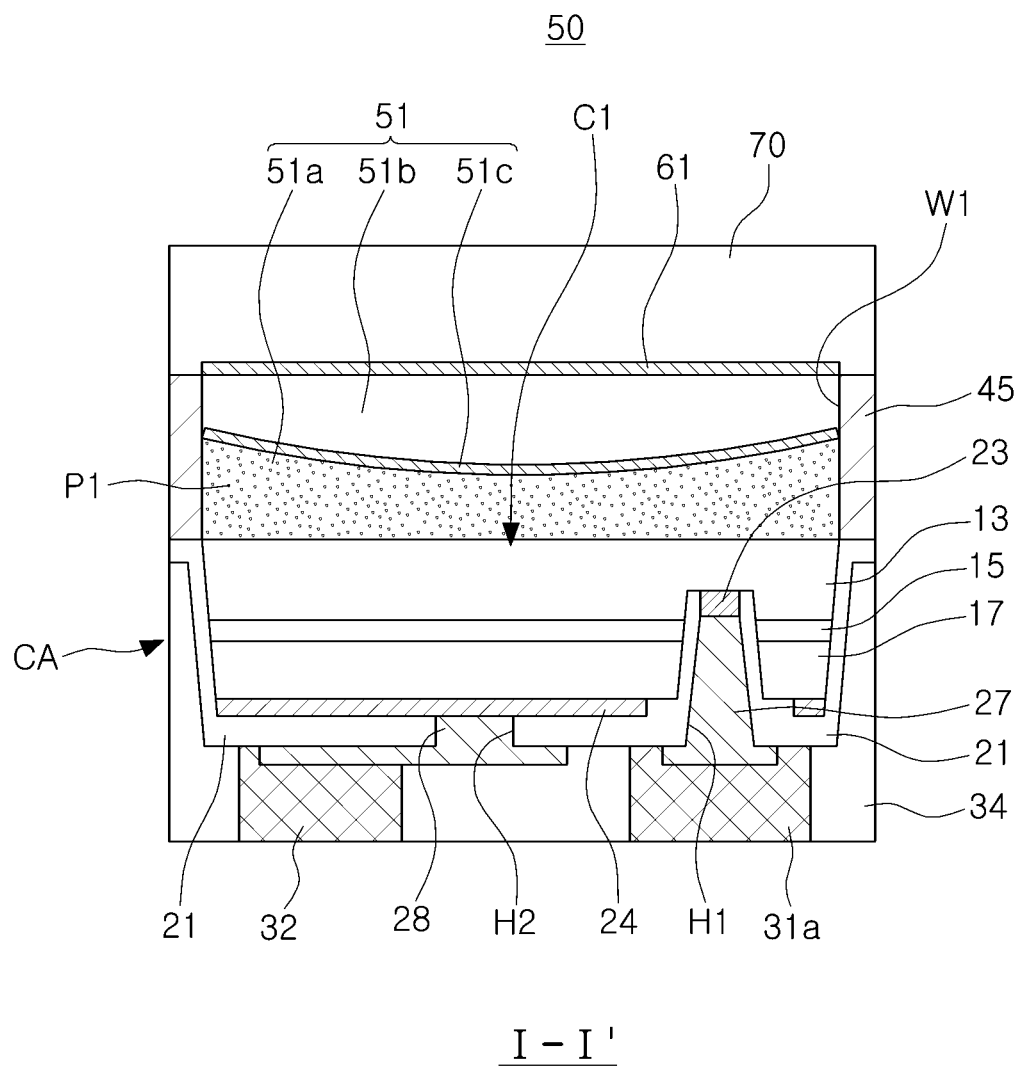
FIG. 5 is a cross-sectional view taken along line I-I' of FIG. 3.
Figure 6:
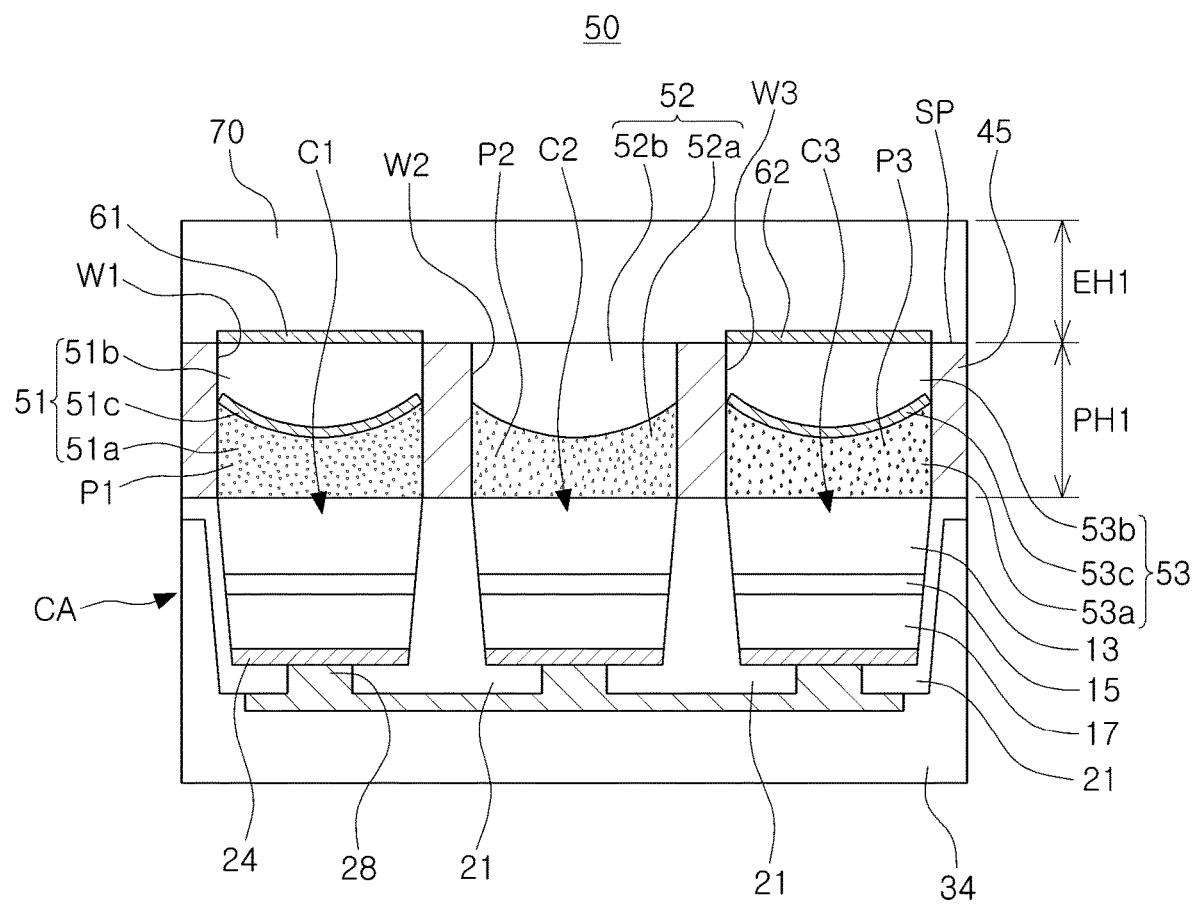
FIG. 6 is a cross-sectional view taken along line II-II' of FIG. 3.

FIG. 1 is a schematic perspective view illustrating a display panel including a light emitting device package according to an example embodiment of the present inventive concept. FIG. 2 is an enlarged plan view of region A of FIG. 1. FIG. 3 is a schematic plan view of a light emitting device package according to an example embodiment of the present inventive concept. FIG. 4 is a schematic rear view of a light emitting device package according to an example embodiment of the present inventive concept. FIG. 5 is a cross-sectional view taken along line I-I' of FIG. 3. FIG. 6 is a cross-sectional view taken along line II-II' of FIG. 3.

Referring to FIGS. 1 and 2, a display panel 1 may include a circuit board 3 and a light emitting device module 2 disposed on the circuit board 3.

According to an example embodiment, the light emitting device module 2 may include a plurality of light emitting device packages 50 that may selectively emit red, green, or blue (RGB) light. Each of the plurality of light emitting device packages 50 may form a single pixel of the display panel 1, and may be disposed on the circuit board 3 to form rows and columns. As illustrated in FIG. 1, the light emitting device packages 50 may be exemplified as being arranged in a 15×15 matrix, but this arrangement is only for ease of description. Actually, a larger number of light emitting device packages may be arranged, depending on a required resolution (for example, 1024×768 or 1920×1080).

The light emitting device package 50 may include sub-pixels corresponding to RGB light sources, and the sub-pixels may have a structure in which they may be spaced apart from each other. This will be described in more detail later. A color of a sub-pixel is not limited to RGB, but a cyan, yellow, magenta, or black (CYMK) light source may also be used as the sub-pixel.

According to an example embodiment, the circuit board 3 may include a driving unit supplying power to the respective light emitting device packages 50 of the light emitting device module 2, and a control unit, controlling the light emitting device packages 50.

In certain embodiments, the display panel 1 may include a first molding part 4 disposed on the circuit board 3. The first molding part 4 may include a black matrix. For example, the black matrix may be disposed around the circuit board 3 to function as a guide line defining a mounting region of the light emitting device package 50. The black matrix is not limited to black. A white or green matrix may be used instead of the black matrix, depending on the purposes or uses of products, and a matrix formed of a transparent material may also be used in certain embodiments. The white matrix may include a reflective material or a light scattering material. The black matrix may include at least one among materials such as a polymer containing a resin, a ceramic, a semiconductor, and a metal.

Referring to FIG. 2, each of the light emitting device packages 50 may be surrounded by a second molding part 5. The second molding part 5 may be formed of a black matrix, and regions surrounded by the second molding part 5 may be provided as light emitting regions in which the light emitting device packages 50 may be disposed, respectively, while an external region of the second molding part 5 may be a non-light emitting region. For example, the area overlapping the second molding part 5 may be a non-light emitting region. The second molding part 5 may electrically separate the light emitting device packages 50 from each other, and each of the light emitting device packages 50 may thus be independently driven as a single pixel.

Referring to FIGS. 3 through 6, a light emitting device package 50 according to an example embodiment may include a cell array CA having first to third semiconductor light emitting parts C1 to C3, first to third wavelength conversion parts 51 to 53 disposed on one surface of the cell array CA to correspond to the first to third semiconductor light emitting parts C1 to C3, and a partition structure 45 separating the first to third wavelength conversion parts 51 to 53 from one another. For example, as illustrated in FIGS. 5 and 6, the cell array CA may include the first to third semiconductor light emitting parts C1 to C3 and an insulating part 21 surrounding each of the first to third semiconductor light emitting parts C1 to C3. For example, each of the semiconductor light emitting parts C1 to C3 may compose a cell of the cell array, and each of the cells may be a light emitting diode including a first conductive semiconductor layer 13, an active layer 15 and a second conductive semiconductor layer 17.

As illustrated in FIGS. 5 and 6, each of the first to third semiconductor light emitting parts C1 to C3 may include epitaxial layers such as a first conductive semiconductor layer 13, an active layer 15, and a second conductive semiconductor layer 17. Such epitaxial layers may be grown on a single wafer by the same process. For example, the first and second conductive semiconductor layers 13 and 17 may be semiconductor layers including impurities. For example, the first conductive semiconductor layer 13 may be an n-type semiconductor layer or a p-type semiconductor layer, and the second conductive semiconductor layer 17 may be a p-type semiconductor layer or an n-type semiconductor layer. For example, the first and second conductive semiconductor layers 13 and 17 may have opposite polarities from each other. The active layers 15 of the first to third semiconductor light emitting parts C1 to C3 may emit the same light. For example, the active layer 15 may emit blue light, for example, light having a wavelength of 440 nm to 460 nm, or ultraviolet light, for example, light having a wavelength of 380 nm to 440 nm.

The cell array CA may include insulating parts 21 respectively surrounding the first to third semiconductor light emitting parts C1 to C3. The insulating part 21 may electrically separate the first to third semiconductor light emitting parts C1 to C3 from one another. As illustrated in FIG. 6, the insulating part 21 may be coplanar with the first to third semiconductor light emitting parts C1 to C3.

The insulating part 21 may be formed of a material having electrical insulating properties. For example, the insulating part 21 may be formed of a silicon oxide, a silicon oxynitride, or a silicon nitride. The insulating part 21 employed in an example embodiment may include a material having low light absorption or reflectivity, or a reflective structure. Such an insulating part 21 may block optical interference among the first to third semiconductor light emitting parts C1 to C3, to ensure independent driving of the first to third semiconductor light emitting parts C1 to C3. In a certain example, the insulating part 21 may have a distributed Bragg reflector (DBR) structure in which a plurality of insulating layers having different refractive indexes are alternately stacked. Such a DBR structure may have the insulating layers having different refractive indexes, and may be repeatedly stacked from 2 to 100 times. The insulating layers may be selected from an oxide or nitride such as $SiO_2$, SiN, $SiO_xN_y$, $TiO_2$, $Si_3N_4$, $Al_2O_3$, $ZrO_2$, TiN, AlN, TiAlN, or TiSiN.

The insulating part 21 and the partition structure 45 may be connected to each other. For example, the partition structure 45 may be formed on the insulating part 21. A combination of the insulating part 21 and the partition structure 45 may extend from a space among cells to a space among the first to third wavelength conversion parts 51 to 53, thereby effectively blocking inter-cell optical interference on an overall optical path. For example, the partition structure 45 and the insulating part 21 may be formed to isolate respective combinations of light emitting parts C1, C2 and C3 and their corresponding wavelength conversion parts 51, 52 and 53 from each other.

The light emitting device package 50 may include an electrode part disposed on the other surface of the cell array CA, and electrically connected to the first to third semiconductor light emitting parts C1 to C3. The electrode part may be configured such that the first to third semiconductor light emitting parts C1 to C3 may be selectively driven. For example, the first to third semiconductor light emitting parts C1 to C3 may be independently driven by different electric voltages and/or different electric currents from each other, thereby producing, various colors and/or levels of brightness with various combinations of different levels of brightness of the respective first to third light emitting parts C1 to C3, for example, in combination with the first to third wavelength conversion parts 51 to 53.

In an example embodiment, as illustrated in FIG. 4, the electrode part may include three first electrode pads 31a to 31c, respectively connected to three semiconductor light emitting parts C1 to C3, and a second electrode pad 32 commonly connected to the three semiconductor light emitting parts C1 to C3.

The three first electrode pads 31a to 31c may be independently connected to respective patterns of the first conductive semiconductor layer 13 of the first to third semiconductor light emitting parts C1 to C3 by respective three first connecting electrodes 27. The second electrode pad 32 may be commonly connected to patterns of the second conductive semiconductor layer 17 of the first to third semiconductor light emitting parts C1 to C3 by a single second connecting electrode 28. For example, the first and second connecting electrodes 27 and 28 may be connected to the first and second conductive semiconductor layers 13 and 17, respectively, through first and second through holes H1 and H2 formed in the insulating part 21. The electrode part employed in an example embodiment may include first and second contact electrodes 23 and 24. The first and second through holes H1 and H2 may allow portions of the first and second contact electrodes 23 and 24 to be exposed so that the first and second contact electrodes 23 and 24 may be connected to the first and second connecting electrodes 27 and 28 respectively. While the first connecting electrodes 27 are formed in three first through holes H1 individually, the second connecting electrode 28 may be formed such that portions thereof formed in three second through holes H2 may be connected to one another. For example, the second connecting electrode 28 may be formed to electrically connect three adjacent patterns of the second conductive semiconductor layer 17 via second through holes H2 respectively formed on the three adjacent patterns of the second conductive semiconductor layer 17. Such an electrode part may vary depending on arrangements of a cell or an electrode pad. For example, in certain embodiments, adjacent patterns of the first conductive semiconductor layer 13 may be electrically connected instead of the patterns of the second conductive semiconductor layer 17 of the above embodiment. In this example, the adjacent patterns of the second semiconductor layer 17 may be electrically insulated from each other, and the other structures including the first and second connecting electrodes 27 and 28 may be modified accordingly.

The light emitting device package 50 may include an encapsulation 34, exposing the first electrode pads 31a to 31c and the second electrode pad 32 while encapsulating the cell array CA. The encapsulation 34 may have a high Young's modulus in order to strongly support the light emitting device package 50. The encapsulation 34 may contain a material having a high level of thermal conductivity, in order to effectively emit heat generated by the first to third semiconductor light emitting parts C1 to C3. For example, the encapsulation 34 may be an epoxy resin or a silicone resin. The encapsulation 34 may contain light-reflective particles reflecting light. The light-reflective particles may be titanium dioxide ($TiO_2$) or aluminum oxide ($Al_2O_3$) particles, but is not limited thereto.

The partition structure 45 may have first to third light emitting windows W1 to W3 disposed on positions corresponding to those of the first to third semiconductor light emitting parts C1 to C3. The first to third light emitting windows W1 to W3 may be provided as spaces for forming the first to third wavelength conversion parts 51 to 53, respectively. For example, the first to third wavelength conversion parts 51 to 53 may be formed in the first to third light emitting windows W1 to W3. The partition structure 45 may contain a light blocking material such that light penetrating through the first to third wavelength conversion parts 51 to 53 may not interfere with light simultaneously coming through either or both of the other two wavelength conversion parts 51 to 53. For example, the partition structure 45 may include a black matrix. As illustrated in FIG. 6, an upper surface of the partition structure 45 may form a coplanar surface SP with upper surfaces of the first to third wavelength conversion parts 51 to 53. The partition structure 45 may have a height PH1 of at least about 32 um. For example, this minimum height of the partition structure 45 may be helpful for the first to third wavelength conversion parts 51 to 53 to jointly emit effective white light when the first to third wavelength conversion parts 51 to 53 emit RGB light respectively.

The first to third wavelength conversion parts 51 to 53 may adjust wavelengths of light emitted by the first to third semiconductor light emitting parts C1 to C3, into wavelengths of light having different colors, respectively. In an example embodiment, the first to third wavelength conversion parts 51 to 53 may emit RGB light, respectively. The upper surfaces of the first to third wavelength conversion parts 51 to 53 may be flat, and may be disposed to share a coplanar surface SP. The upper surfaces of the first to third wavelength conversion parts 51 to 53 may also share the coplanar surface SP with the upper surface of the partition structure 45. Thus, since the upper surfaces of the first to third wavelength conversion parts 51 to 53 may be flat, a process of forming an additional thick molding layer in order to planarize the upper surfaces of the first to third wavelength conversion parts 51 to 53 may be omitted. For example, the upper surfaces of the first to third wavelength conversion parts 51 to 53 and the upper surface of partition structure 45 may be formed to be coplanar without a planarizing process. In certain embodiments, a planarizing process may be performed to make the upper surfaces of the first to third wavelength conversion parts 51 to 53 and the upper surface of the partition structure 45 coplanar. In certain embodiments, a thick molding layer may be formed to flatten the upper surfaces of the wavelength conversion parts 51 to 53 and the partition structure 45 in cases that the upper surfaces are uneven. The thick molding layer may cause a warpage in the light emitting device package 50 in a process in which the thick molding layer is hardened. In certain examples, the warpage may cause damage, e.g., a crack, in the light emitting device package 50. However, in the embodiments in which the upper surfaces of the wavelength conversion parts 51 to 53 and the partition structure 45 are coplanar, the thick molding layer may be omitted, and thus, a warpage phenomenon may be removed or reduced. For example, such a light emitting device package 50 without a warpage may exhibit improved optical characteristics, e.g., intended characteristics in the design of the light emitting device package 50.

In certain embodiments, the first to third wavelength conversion parts 51 to 53 may include multiple layers respectively. As illustrated in FIG. 6, when the first to third wavelength conversion parts 51 to 53 include two layers respectively, curved, e.g., concave, surfaces may be formed on first phosphor layers 51a, 52a, and 53a. Second phosphor layers 51b, 52b, and 53b may be disposed on or above the respective first phosphor layers 51a, 52a, and 53a. According to an example embodiment, each of the first phosphor layers 51a, 52a, and 53a may include a mixture of RGB phosphors to emit white light to corresponding one of the second phosphor layers 51b, 52b, and 53b. In certain embodiments, the second phosphor layers 51b, 52b and 53b may be replaced with transparent resin layers which do not include phosphor material therein.

As illustrated in FIG. 6, when the first to third semiconductor light emitting parts C1 to C3 emit blue light, the first and third wavelength conversion parts 51 and 53 may include the first phosphor layers 51a and 53a having green and red phosphors P1 and P3, respectively. The first phosphor layer 51a may be formed by dispensing a light-transmitting liquid resin, mixed with the green phosphor P1 into the first light emitting window W1. Similarly, the first phosphor layer 53a may be formed by dispensing a light-transmitting liquid resin mixed with the red phosphor P3 into the third light emitting window W3. The first phosphor layers 51a and 53a may have a curved, e.g., concave, surface formed thereon due to surface tension in a process of curing a light-transmitting liquid resin. For example, phosphor layers disclosed in various embodiments of the present disclosure may be respectively formed of a mixture of a transparent resin and a phosphor.

In certain embodiments, the first and third wavelength conversion parts 51 and 53 may include light filter layers 51c and 53c, formed between the first phosphor layers 51a and 53a and the second phosphor layers 51b and 53b to selectively block blue light. Use of the light filter layers 51c and 53c may allow the first and third light emitting windows W1 and W3 to emit light from which blue light is removed. For example, the light filters 51c and 53c may absorb a certain wavelength range of blue light.

The second wavelength conversion part 52 may be formed by dispensing a light-transmitting liquid resin not mixed with a phosphor. In certain embodiments, the second wavelength conversion part 52 may include a blue or blue-green phosphor for adjusting color coordinates of blue light, for example, a phosphor emitting light having a wavelength of 480 nm to 520 nm. Such a phosphor may adjust color coordinates of blue light emitted by the second wavelength conversion part 52. For example, the phosphor density in the second wavelength conversion part 52 may be less than that of the first and third wavelength conversion parts 51 and 53. According to an example embodiment, the second wavelength conversion part 52 may include the first and second phosphor layers 52a and 52b, and the second phosphor layer 52b may include a combination of RGB phosphors to emit white light, or may be replaced with a transparent resin layer not including a phosphor material therein. The first phosphor layer 52a may be formed by dispensing a light-transmitting liquid resin, mixed with a blue or blue-green phosphor P2, into the second light emitting window W2. The first phosphor layer 52a may have a curved, e.g., concave, surface formed thereon due to surface tension in a process of curing a light-transmitting liquid resin.

In certain embodiments, the first and third wavelength conversion parts 51 and 53 may have color filter layers 61 and 62 formed thereon to selectively transmit light within a desired wavelength band. Use of the color filter layers 61 and 62 may allow the first and third wavelength conversion parts 51 and 53 to emit only desired green and red light, respectively. For example, the color filter layers 61 and 62 may be formed in the first and third light emitting windows W1 and W3 respectively. Alternatively, the color filter layers 61 and 62 may be formed above the first and third light emitting windows W1 and W3 respectively. For example, the color filter layers 61 and 62 may be included in the first and third wavelength conversion parts 51 and 53 respectively. In certain embodiments, the first and third color filter layers 61 and 63 may be formed on the first and third wavelength conversion parts 51 and 53 respectively. FIG. 6 shows an example in which the color filter layers 61 and 62 are not included in their corresponding wavelength conversion parts 51 and 53. A resin layer 70 may be disposed on the upper surfaces of the first to third wavelength conversion parts 51 to 53. The resin layer 70 may include a material that is helpful for reducing degradation of the phosphor included in the respective wavelength conversion parts 51 to 53. The resin layer 70 may be formed by spin coating, and may have a thickness EH1 of about 50 μm or less.

Figure 7:
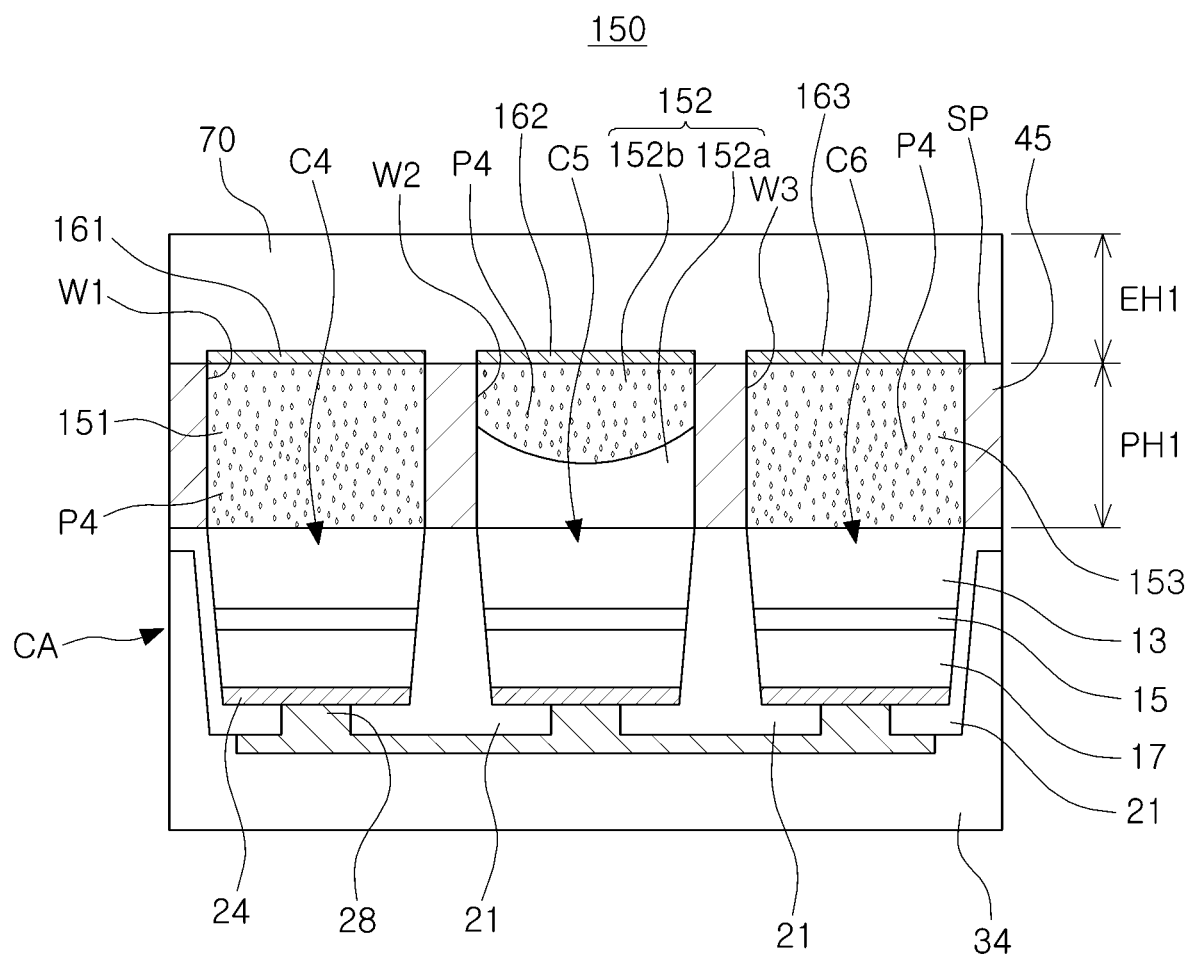
FIG. 7 is a schematic cross-sectional view of a light emitting device package according to an example embodiment of the present inventive concept.

FIG. 7 is a schematic cross-sectional view of a light emitting device package according to an example embodiment of the present inventive concept. FIG. 7 differs from the above-described example embodiments in a configuration of a phosphor forming first to third wavelength conversion parts 151 to 153. In certain embodiments, the first to third wavelength conversion parts 151 to 153 may have color filter layers 161, 162 and 163 formed thereon to selectively transmit light within a desired wavelength band. For example, the color filter layers 161, 162 and 163 may be included in or formed on the wavelength conversion parts 151, 152 and 153 as similarly described in the previous embodiments. Configurations that are the same as those in the above-described example embodiment, will be omitted in detailed descriptions below. As illustrated in FIG. 7, the first to third wavelength conversion parts 151 to 153 may be formed by dispensing a mixture of a phosphor P4 and a liquid resin. The phosphor P4 may be a mixture of red, green and blue phosphors in order for the wavelength conversion parts to emit white light. According to an example embodiment, a transparent resin layer 152a may be disposed in the second wavelength conversion part 152 emitting blue light.

Figure 8:
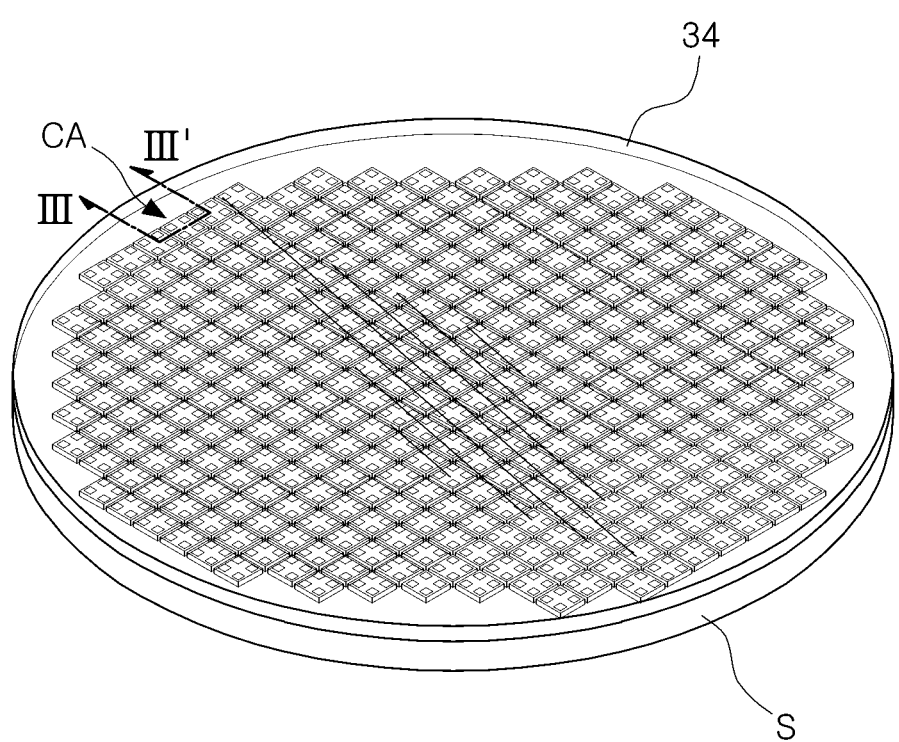
FIG. 8 is a schematic perspective view of a wafer according to an embodiment of the present disclosure which includes a light emitting device package of FIG. 6.
Figure 9:
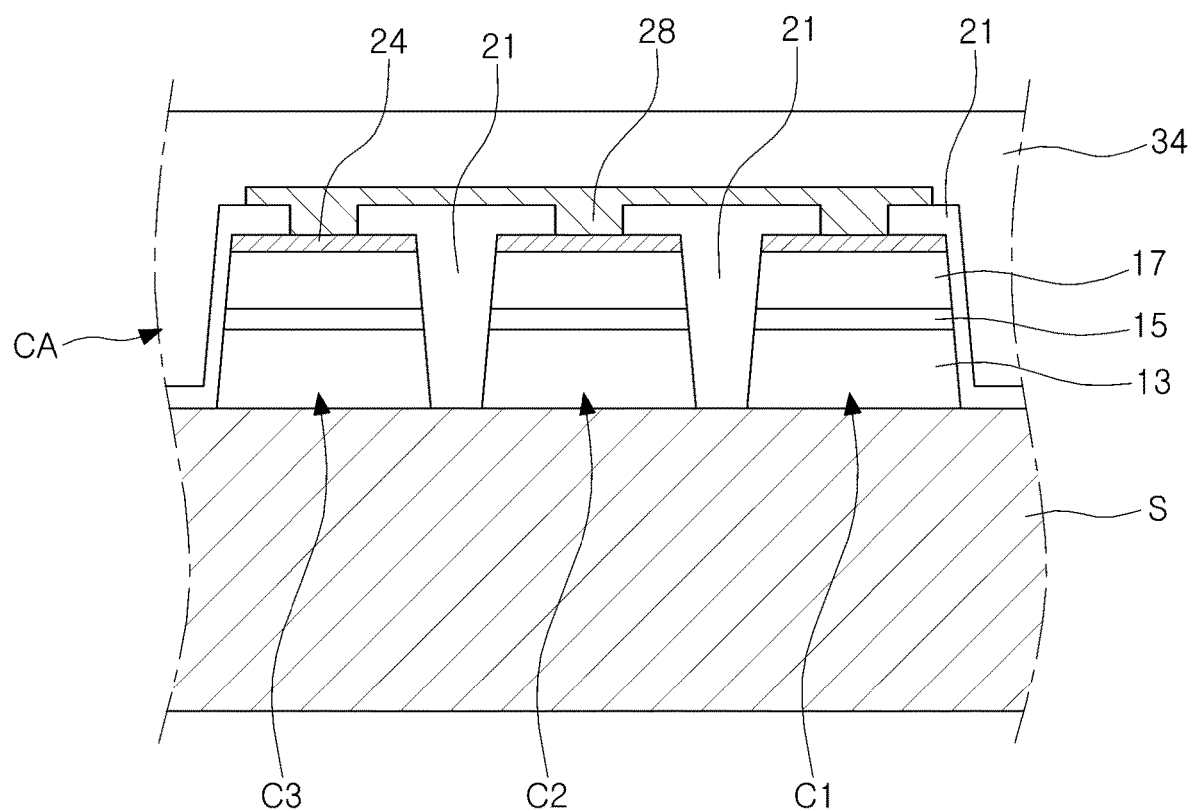
FIGS. 9 through 13 are schematic cross-sectional views illustrating a process of manufacturing the light emitting device package of FIG. 6.

Referring to FIGS. 8 through 13, a method of fabricating a light emitting device package according to an example embodiment of the present inventive concept will be described hereinafter. FIG. 8 is a schematic perspective view of a wafer according to an embodiment of the present disclosure which includes a light emitting device package of FIG. 6. FIGS. 9 through 13 are schematic cross-sectional views illustrating a process of manufacturing the light emitting device package of FIG. 6. FIG. 9 is a cross-sectional view taken along line of FIG. 8.

For example, a method of manufacturing the light emitting device package relates to a method of manufacturing a wafer-level chip scale package. A chip scale package may have a size substantially the same as that of a semiconductor light emitting device package. Thus, when the chip scale package is used in a display panel, a high-resolution display panel may be manufactured by reducing a pixel size and a pixel pitch of the chip scale package. Since all processes of the method of manufacturing a wafer-level chip scale package are performed at a wafer level, the method may be suited for mass production, and may enable an optical structure such as a wavelength conversion part containing a phosphor or a filter to be manufactured to be integrated with a semiconductor light emitting part.

As illustrated in FIGS. 8 and 9, a cell array CA may be prepared on a wafer S, a growth substrate, and the cell array CA may include the first to third semiconductor light emitting parts C1 to C3, each including patterns of the first conductive semiconductor layer 13, the active layer 15, the second conductive semiconductor layer 17, and the insulating part 21 surrounding each of the first to third semiconductor light emitting parts C1 to C3. A connecting electrode 28 may be formed on the cell array CA to be electrically connected to the first to third semiconductor light emitting parts C1 to C3. An encapsulation 34 may be formed on the cell array CA and the connecting electrode 28.

Figure 10:
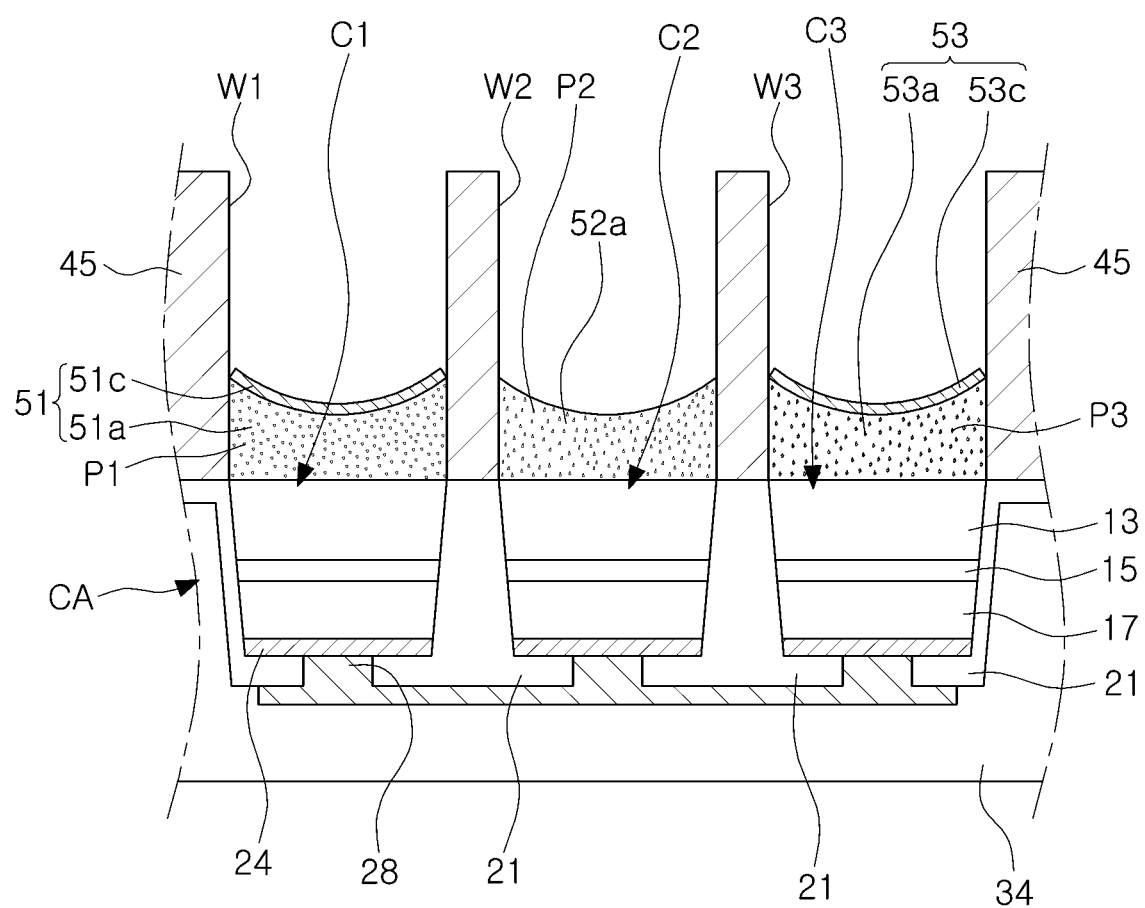

As illustrated in FIG. 10, the partition structure 45 having the first to third light emitting windows W1 to W3 may be formed by etching portions of the growth substrate, e.g., portions of the layer (formed on the growth substrate) forming the partition structure 45, corresponding to the first to third semiconductor light emitting parts C1 to C3, and the first phosphor layers 51a and 53a may be formed by dispensing a light-transmitting liquid resin, mixed with a wavelength conversion material such as the green or red phosphor P1 or P3, into each of the first and third light emitting windows W1 and W3. In certain embodiments, the first phosphor layer 52a may be formed by dispensing, into the second light emitting window W2, a light-transmitting liquid resin mixed with a phosphor P2, e.g., the blue or blue-green phosphor, for adjusting color coordinates of blue light, for example, a phosphor emitting light having a wavelength of 480 nm to 520 nm. According to an example embodiment, a light-transmitting liquid resin not mixed with a phosphor may be dispensed into the second light emitting window W2. The concave curved surface may be formed on the first phosphor layers 51a, 52a, and 53a due to surface tension in a process of curing a light-transmitting liquid resin, and may affect optical characteristics of light emitted by the first to third semiconductor light emitting parts C1 to C3 to be distorted, thus causing reduction of color reproduction capability of a light emitting device package. The reduction of color reproduction capability may be addressed by a following process of dispensing an additional resin layer on the first phosphor layers 51a, 52a, and 53a and planarizing the dispensed additional resin layer, or of directly planarizing the first phosphor layers 51a, 52a, and 53a. In certain embodiments, the first to third wavelength conversion parts 51 to 53 may include the light filter layers 51c and 53c selectively blocking blue light emitted by the active layer 15.

Figure 11:
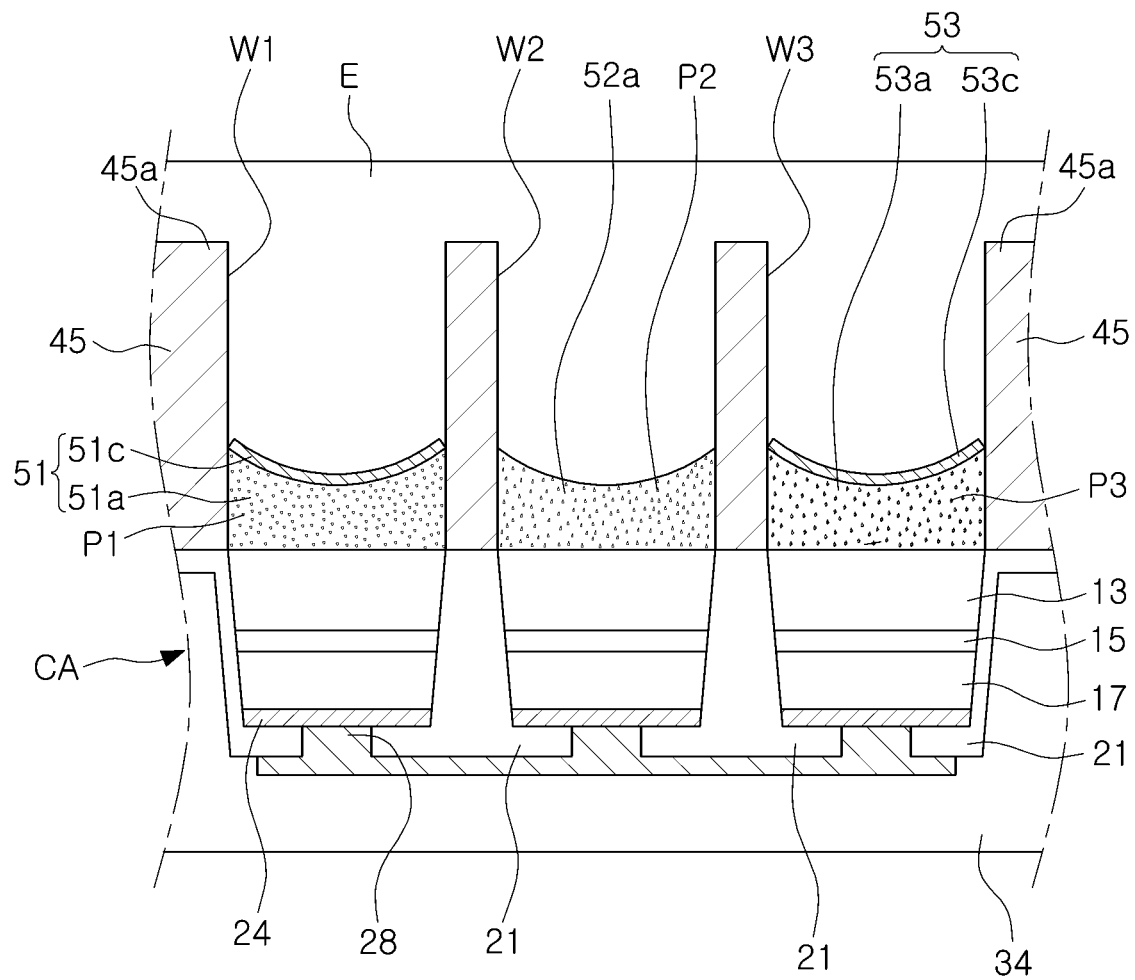

As illustrated in FIG. 11, a light-transmitting resin layer E may be formed to cover an upper end 45a of the partition structure 45. For example, the light-transmitting resin layer E may be formed by coating a light-transmitting resin such as an epoxy resin or a silicone resin.

Figure 12:
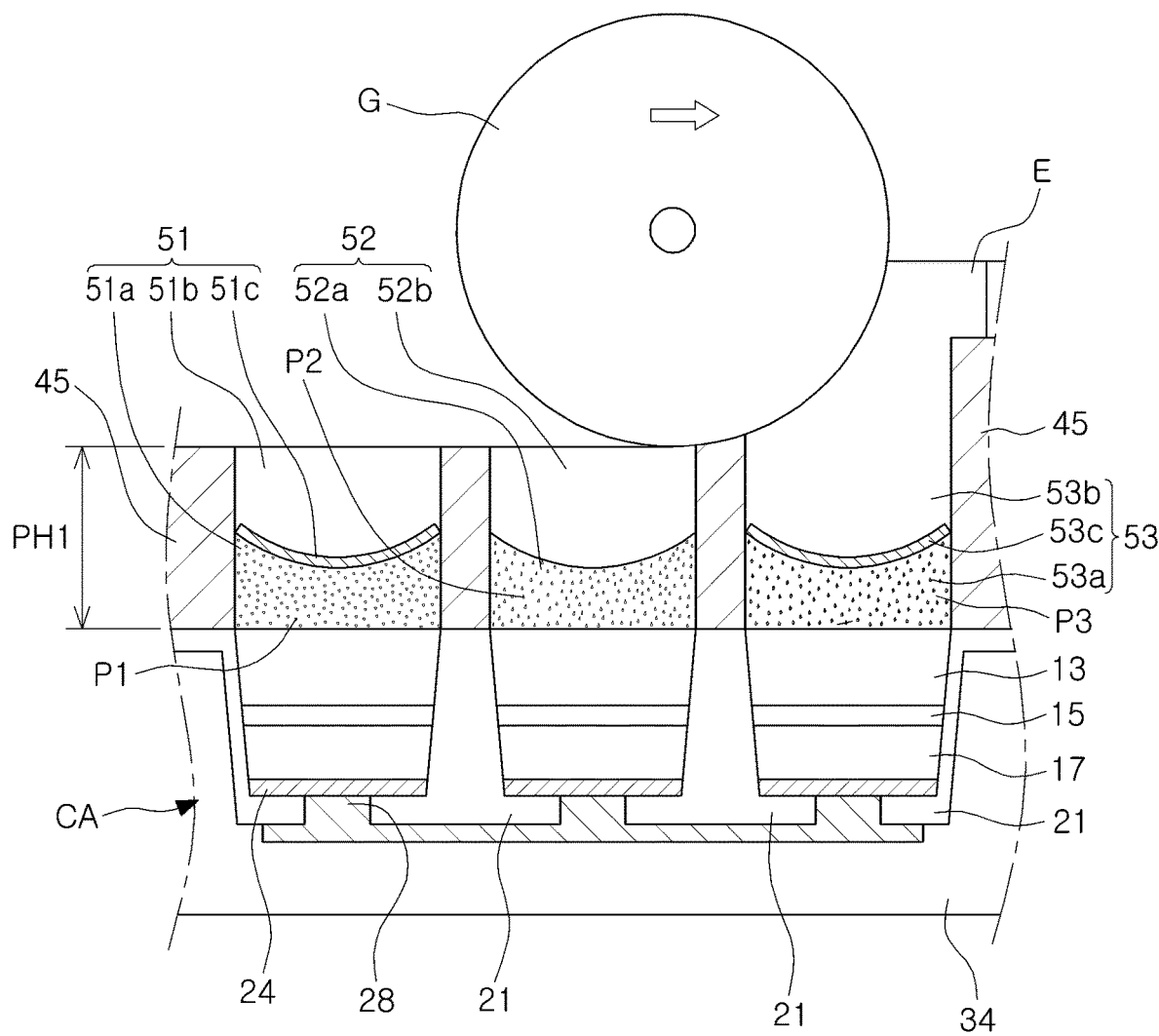
Figure 13:
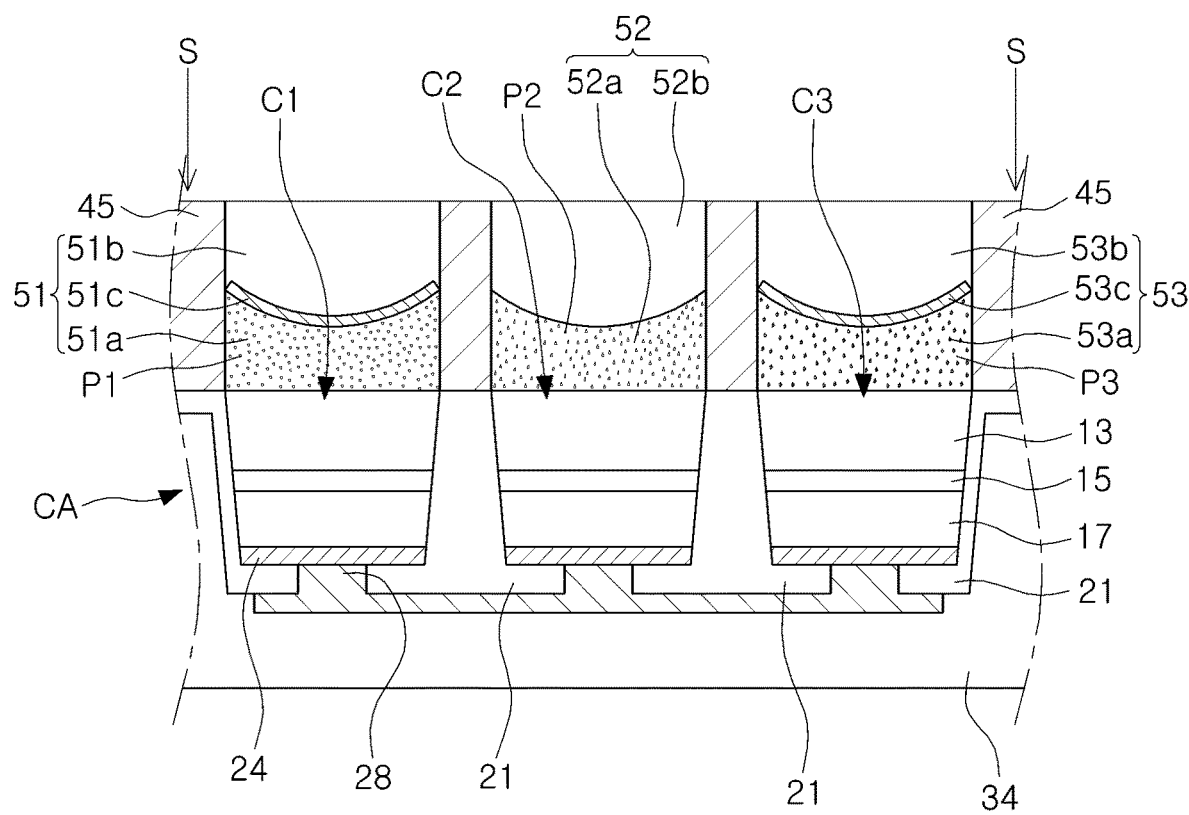

As illustrated in FIG. 12, the partition structure 45 and the first to third wavelength conversion parts 51 to 53 may be planarized by being ground to a uniform height PH1 using a grinder G. The first to third wavelength conversion parts 51 to 53 may be planarized to a height PH1 of at least about 32 μm in order to emit effective white light. A process of planarizing the partition structure 45 and the first to third wavelength conversion parts 51 to 53 may be performed by polishing or chemical mechanical polishing (CMP), in addition to grinding. In some embodiments, a surface of the light-transmitting resin layer E may be ground by the planarizing process. In certain embodiments, a portion of the light-transmitting resin layer E and a portion of the partition structure 45 may be removed by the planarizing process. According to an example embodiment, the surfaces of the first to third wavelength conversion parts 51 to 53 may also be ground such that at least respective regions of the first phosphor layers 51a, 52a, and 53a may be exposed. Such a process may allow the surfaces of the first to third wavelength conversion parts 51 to 53 to be planarized, thus preventing optical characteristics of the light emitting device package from being distorted and/or degraded by a concave and/or curved surface formed on surfaces of the first phosphor layers 51a, 52a, and 53a.

As illustrated in FIG. 6, the color filter layers 61 and 62 may be disposed on the first and third light emitting windows W1 and W3, respectively, the resin layer 70 may be coated on the color filter layers 61 and 62 by spin coating, and then the resultant structure may be cut into individual semiconductor light emitting device units, thus resulting in the light emitting device package 50 illustrated in FIGS. 5 and 6.

Figure 14:
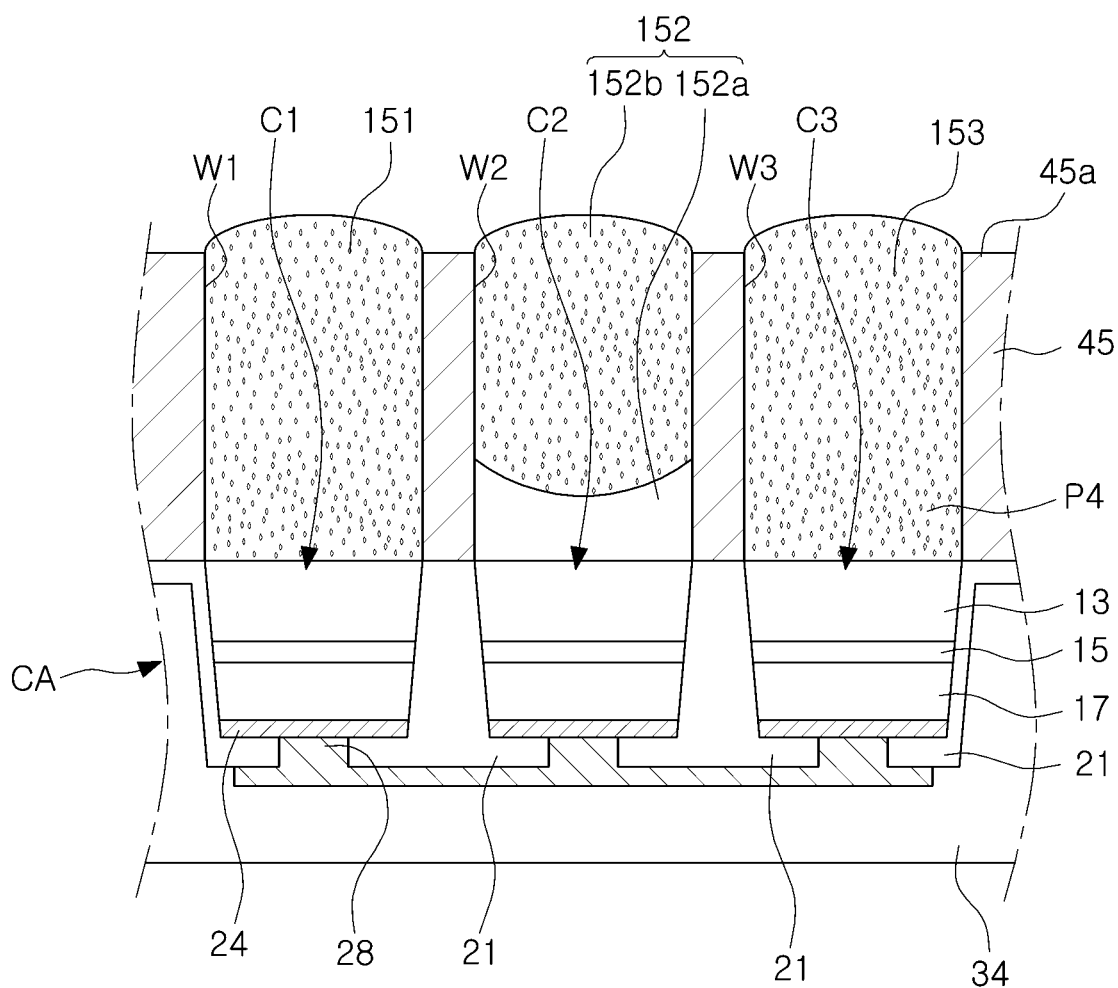
FIGS. 14 and 15 are schematic cross-sectional views illustrating a process of manufacturing a light emitting device package of FIG. 7.
Figure 15:
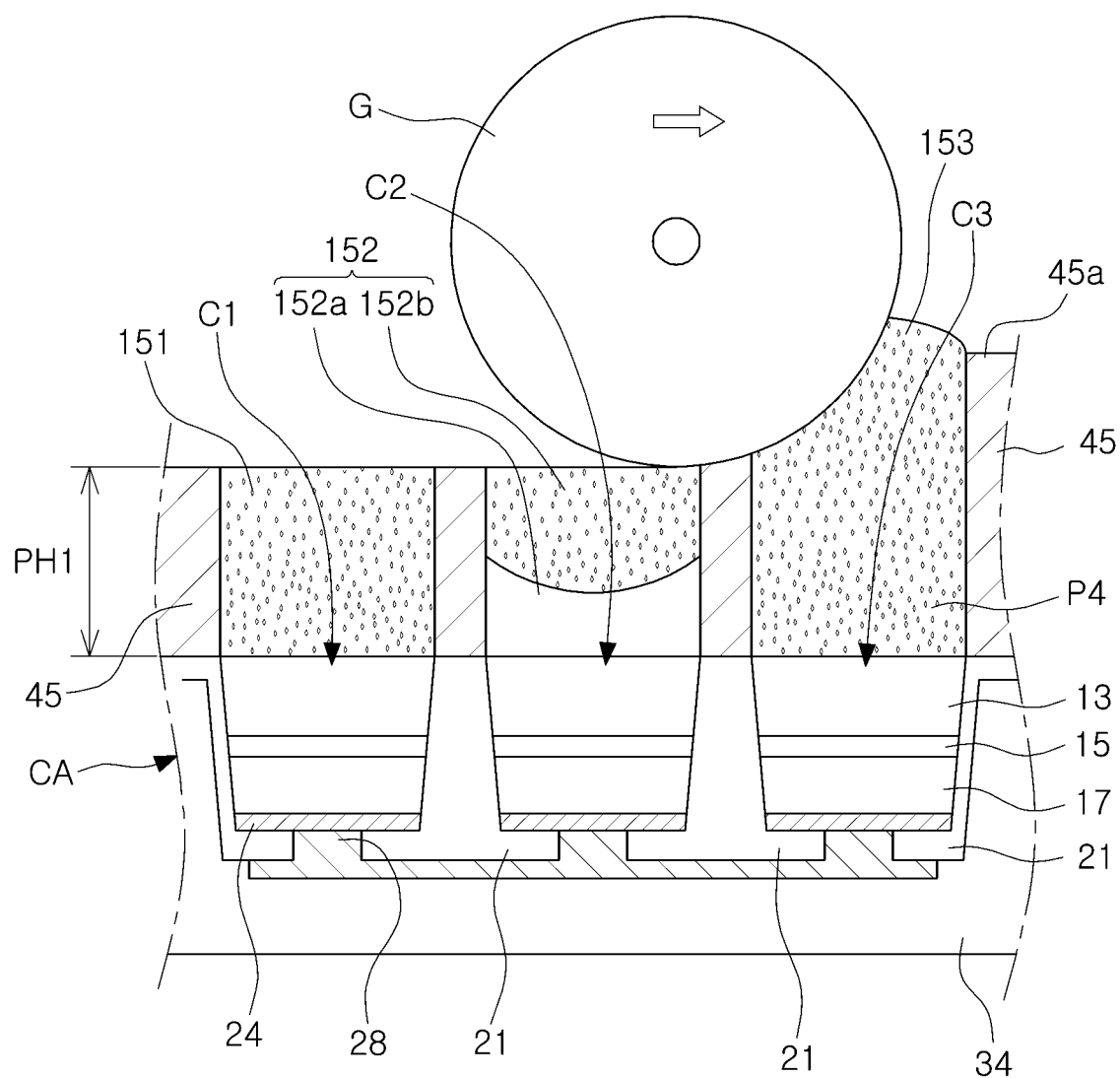

A method of manufacturing a light emitting device package according to an example embodiment, will be described with reference to FIGS. 14 and 15. FIGS. 14 and 15 are schematic cross-sectional views illustrating a process of manufacturing a light emitting device package of FIG. 7. Since the previous processes performed prior to the step illustrated in FIG. 14 are the same as those illustrated in the example embodiment of FIG. 9, a detailed description thereof is omitted.

As illustrated in FIG. 14, the partition structure 45 having the first to third light emitting windows W1 to W3 may be formed by etching the portions of the growth substrate, e.g., portions of the layer (formed on the growth substrate) forming the partition structure 45, corresponding to the first to third semiconductor light emitting parts C1 to C3, and a light-transmitting liquid resin mixed with the RGB phosphor P4 may be dispensed into each of the first to third light emitting windows W1 to W3 to a height higher than the upper end 45a of the partition structure 45. Here, a convex curved surface may be formed on a surface of the light-transmitting liquid resin due to surface tension. According to an example embodiment, a transparent resin layer may also be dispensed first on a lower portion of at least one light emitting window. FIG. 14 illustrates the transparent resin layer 152a being dispensed into the second light emitting window W2. The transparent resin layer 152a may be formed of a light-transmitting resin such as an epoxy resin or a silicone resin.

As illustrated in FIG. 15, the partition structure 45 and the first to third wavelength conversion parts 151 to 153 may be planarized to the uniform height PH1 using the grinder G. As illustrated in the above-described example embodiment, the first to third wavelength conversion parts 151 to 153 may be planarized to the height PH1 of at least about 32 μm in order to emit effective white light. For example, the wavelength conversion parts 151 to 153 may benefit from having certain minimum thickness to convert light emitted from the semiconductor light emitting parts C1 to C3 into proper wavelength spectrums respectively, and thereby producing a proper color temperature of a white light by combination of the color elements of the device package. The process of planarizing the partition structure 45 and the first to third wavelength conversion parts 151 to 153 may be performed by grinding, polishing, and/or CMP.

Subsequently, color filter layers 161, 162, and 163 (refer to FIG. 7) may be disposed on the first to third light emitting windows W1 to W3, respectively, the resin layer 70 may be coated onto the color filter layers 161, 162, and 163 by spin coating, and then the resultant structure may be cut into individual semiconductor light emitting device units, thus resulting in the light emitting device package 150 illustrated in FIG. 7.

In certain embodiments, the resultant structure may not be cut into individual semiconductor light emitting device units. For example, the semiconductor light emitting device units formed on the wafer or another substrate may be used as a display without separating the semiconductor light emitting device units individually. In certain embodiments, the resultant structure may be cut into blocks, and each block may include a plurality of semiconductor light emitting device units. (For example, a semiconductor light emitting device unit may be a light emitting device package 50 described above embodiments.) A display may be composed of a plurality of blocks of the resultant structure described above.

As set forth above, according to example embodiments of the present inventive concept, a method of fabricating a light emitting device package with improved color reproduction capability by planarizing surfaces of a plurality of wavelength conversion parts may be provided.

While exemplary embodiments have been shown and described above, it will be apparent to those skilled in the art that modifications and variations could be made without departing from the scope of the present inventive concept, as defined by the appended claims.

What is claimed is:

1. A method of fabricating a light emitting device package comprising in sequence:

(1) forming a plurality of semiconductor light emitting parts above a growth substrate, each having a first conductive semiconductor layer, an active layer, and a second conductive semiconductor layer vertically stacked on the growth substrate;

(2) after forming the plurality of semiconductor light emitting parts, and after the plurality of semiconductor light emitting parts are moved to be disposed below the growth substrate, forming a partition structure having a plurality of light emitting windows in the growth substrate, the partition structure including partitions formed of a portion of the growth substrate, and each partition formed between two adjacent semiconductor light emitting parts of the plurality of semiconductor light emitting parts in a plan view; and (3) after forming the partition structure and while the plurality of light emitting parts are disposed below the growth substrate:

filling a resin having a wavelength conversion material into each of the plurality of light emitting windows; and forming a plurality of wavelength conversion parts by planarizing a surface of the resin.

2. The method of claim 1, wherein the filling the resin having the wavelength conversion material comprises:

dispensing a first resin having a first wavelength conversion material into a first light emitting window; and dispensing a second resin into the first light emitting window on the first resin, the second resin having a second wavelength conversion material.

3. The method of claim 2, wherein the first wavelength conversion material comprises one of red, green, and blue wavelength conversion materials, and the second wavelength conversion material comprises red, green, and blue wavelength conversion materials.

4. The method of claim 3, further comprising:

forming a blue light blocking filter in the first light emitting window between the first resin and the second resin.

5. The method of claim 1, wherein the filling the resin having the wavelength conversion material comprises:

dispensing a first resin having a first wavelength conversion material into each of the plurality of light emitting windows; and dispensing a second resin on the first resin, wherein the second resin is transparent and does not include a wavelength conversion material in the second resin.

6. The method of claim 1, wherein a surface of the resin convexly protrudes before the planarizing of the surface of the resin.

7. The method of claim 1, wherein the filling the resin having the wavelength conversion material comprises:

dispensing a first resin into at least one of the plurality of light emitting windows; and dispensing a second resin having the wavelength conversion material on the first resin, wherein the first resin is transparent and is not mixed with a wavelength conversion material, wherein a surface of the second resin convexly protrudes.

8. The method of claim 1, wherein the planarizing of the surface of the resin removes at least a portion of the partition structure.

9. The method of claim 8, wherein a remaining height of the partition structure is at least 32 μm or greater.

10. The method of claim 1, wherein the planarizing the surface of the resin is performed by at least one of grinding, polishing, or chemical mechanical polishing.

11. The method of claim 1, after the forming the plurality of wavelength conversion parts, further comprising:

disposing color filters on the plurality of wavelength conversion parts, respectively; and coating an upper resin layer on the plurality of wavelength conversion parts to cover the color filters.

12. The method of claim 11, wherein the coating the upper resin layer is performed by spin coating.

13. The method of claim 11, wherein the upper resin layer is coated at a thickness of 50 μm or less.

14. A method of fabricating a light emitting device package comprising in sequence:

(1) forming a plurality of semiconductor light emitting parts above a growth substrate, each having a first conductive semiconductor layer, an active layer, and a second conductive semiconductor layer vertically stacked on the growth substrate;

(2) after forming the plurality of semiconductor light emitting parts, and after the plurality of semiconductor light emitting parts are moved to be disposed below the growth substrate, forming a partition structure having a plurality of light emitting windows corresponding respectively to the plurality of semiconductor light emitting parts in the growth substrate, the partition structure including partitions formed of a portion of the growth substrate, and each partition formed between two adjacent semiconductor light emitting parts of the plurality of semiconductor light emitting parts in a plan view; and (3) after forming the partition structure and while the plurality of light emitting parts are disposed below the growth substrate:

dispensing a first resin having one of red, green, and blue wavelength conversion materials into each of the plurality of light emitting windows;

dispensing a second resin on the first resin in each of the plurality of light emitting windows, the second resin being transparent and not being mixed with a wavelength conversion material; and forming a plurality of wavelength conversion parts by planarizing a surface of the second resin.

15. A method of manufacturing a light emitting device package comprising in sequence:

(1) forming a light emitting diode (LED) above a substrate;

(2) after forming the LED, and while the LED is below the substrate, forming a wavelength conversion part on the LED; and (3) after forming the wavelength conversion part, and while the LED is still below the substrate, planarizing a top surface of the wavelength conversion part by removing a portion of the wavelength conversion part, wherein the wavelength conversion part comprises a first resin layer including a first wavelength conversion material, a second resin layer, and a light filter disposed between the first and second resin layers, wherein the light emitting diode includes a first semiconductor layer, a second semiconductor layer, and an active layer disposed between the first semiconductor layer and the second semiconductor layer, wherein the first and second semiconductor layers are doped with impurities, and the first and second semiconductor layers have opposite polarities from each other, and wherein the first semiconductor layer, the active layer, the second semiconductor layer, the first resin layer, the light filter and the second resin layer are stacked in a vertical direction for each of the layers to vertically overlap the other layers.

16. The method of claim 15, wherein the wavelength conversion part is configured to convert a wavelength of light emitted from the LED, and the wavelength conversion part comprises a wavelength conversion layer including a mixture of a wavelength conversion material and a first resin, and wherein the planarizing a top surface of the wavelength conversion part comprises removing a portion of the wavelength conversion layer.

17. The method of claim 16, wherein the second resin layer comprises a transparent resin layer including a second resin, and the second resin is not mixed with a wavelength conversion material.

18. The method of claim 15, wherein the wavelength conversion part comprises a wavelength conversion layer and a transparent resin layer,
   wherein the wavelength conversion layer comprises a mixture of a wavelength conversion material and a first resin,
   wherein the transparent resin layer does not include a wavelength conversion material,
   wherein the wavelength conversion layer is disposed between the transparent resin layer and the LED, and
   wherein the planarizing a top surface of the wavelength conversion part comprises removing a portion of the transparent resin layer.

19. The method of claim 15, further comprising:
   forming a light blocking structure surrounding the wavelength conversion part in a plan view.

20. The method of claim 19, wherein a portion of the light blocking structure is removed by the planarizing step, and a top surface of the light blocking structure and the top surface of the wavelength conversion part are coplanar after the planarizing step.

* * * * *